United States Patent
Matsuda (10) Patent No.: US 7,351,285 B2
(45) Date of Patent: Apr. 1, 2008

(54) METHOD AND SYSTEM FOR FORMING A VARIABLE THICKNESS SEED LAYER

(75) Inventor: Tsukasa Matsuda, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 311 days.

(21) Appl. No.: 11/092,266

(22) Filed: Mar. 29, 2005

(65) Prior Publication Data

US 2006/0219160 A1 Oct. 5, 2006

(51) Int. Cl.
*C30B 23/00* (2006.01)
*C23C 16/00* (2006.01)
*B05D 3/00* (2006.01)

(52) U.S. Cl. ............ 117/104; 117/87; 117/88; 117/89; 117/90; 118/723 R; 118/719; 427/248.1; 427/532

(58) Field of Classification Search ............ 427/248.1, 427/532; 117/87, 88, 89, 90, 104; 118/723 R, 118/719
See application file for complete search history.

(56) References Cited

U.S. PATENT DOCUMENTS

| | | | |
|---|---|---|---|
| 5,532,190 A | 7/1996 | Goodyear et al. | |
| 6,303,809 B1 | 10/2001 | Chi et al. ............... | 556/136 |
| 6,319,832 B1 | 11/2001 | Uhlenbrock et al. ....... | 438/681 |
| 6,420,583 B1 * | 7/2002 | Lienhard et al. ............ | 556/136 |
| 6,428,850 B1 | 8/2002 | Shinriki et al. | |
| 6,440,495 B1 | 8/2002 | Wade et al. .............. | 427/250 |
| 6,458,415 B2 * | 10/2002 | Meguro et al. .......... | 427/249.8 |
| 6,478,872 B1 | 11/2002 | Chae et al. | |
| 6,605,735 B2 | 8/2003 | Kawano et al. ............ | 556/136 |
| 6,624,091 B2 * | 9/2003 | Yuan ........................ | 438/778 |
| 6,627,539 B1 * | 9/2003 | Zhao et al. ................ | 438/638 |
| 6,660,245 B1 * | 12/2003 | Gaynor et al. ............ | 423/705 |
| 6,713,373 B1 | 3/2004 | Omstead .................... | 438/608 |

(Continued)

FOREIGN PATENT DOCUMENTS

WO   WO 0208487 A1   1/2002

OTHER PUBLICATIONS

European Patent Office; International Search Report and Written Opinion of corresponding PCT application PCT/US2006/008112; dated Sep. 7, 2006, 11 pgs.

*Primary Examiner*—Robert Kunemund
*Assistant Examiner*—G. Nagesh Rao
(74) *Attorney, Agent, or Firm*—Wood, Herron & Evans, LLP (57) ABSTRACT

A method and system for forming a variable thickness seed layer on a substrate for a subsequent metal electrochemical plating process, where the seed layer thickness profile improves uniformity of the electroplated metal layer compared to when using a constant thickness seed layer. The method includes providing a substrate in a process chamber containing a showerhead, with the center of the substrate generally aligned with an inner gas delivery zone of the showerhead and the edge of the substrate generally aligned with an outer gas delivery zone of the showerhead. The method further includes depositing a seed layer on the substrate by exposing the substrate to a first gas containing a metal-containing precursor flowed through the inner gas delivery zone, and exposing the substrate to a second gas flowed through the outer gas delivery zone, whereby the seed layer is deposited with a thickness at the edge of the substrate that is less than the thickness at the center of the substrate.

12 Claims, 4 Drawing Sheets

U.S. PATENT DOCUMENTS

| | | | |
|---|---|---|---|
| 6,756,235 B1 * | 6/2004 | Liu et al. | 438/3 |
| 6,866,882 B1 * | 3/2005 | Shinriki et al. | 427/126.3 |
| 6,989,321 B2 * | 1/2006 | Yamasaki et al. | 438/584 |
| 7,279,421 B2 * | 10/2007 | Suzuki | 438/680 |
| 2002/0163028 A1 * | 11/2002 | Yuan | 257/303 |
| 2003/0019858 A1 * | 1/2003 | Dornfest et al. | 219/158 |
| 2003/0079686 A1 * | 5/2003 | Chen et al. | 118/715 |
| 2003/0129306 A1 | 7/2003 | Wade et al. | |
| 2004/0013577 A1 | 1/2004 | Ganguli et al. | 422/129 |
| 2004/0050325 A1 | 3/2004 | Samoilov et al. | |
| 2004/0105934 A1 | 6/2004 | Chang et al. | |
| 2004/0241321 A1 | 12/2004 | Ganguli et al. | |
| 2005/0070100 A1 * | 3/2005 | Yamasaki et al. | 438/685 |
| 2005/0081882 A1 | 4/2005 | Greer et al. | 134/1.1 |
| 2005/0110142 A1 | 5/2005 | Lane et al. | 257/751 |
| 2005/0186341 A1 | 8/2005 | Hendrix et al. | 427/248.1 |
| 2005/0221000 A1 * | 10/2005 | Ikeda et al. | 427/248.1 |
| 2006/0110530 A1 * | 5/2006 | Suzuki et al. | 427/248.1 |
| 2006/0110918 A1 * | 5/2006 | Suzuki | 438/674 |
| 2006/0115589 A1 * | 6/2006 | Vukovic | 427/248.1 |
| 2006/0115593 A1 * | 6/2006 | Suzuki et al. | 427/248.1 |
| 2006/0219160 A1 * | 10/2006 | Matsuda | 117/88 |
| 2006/0219177 A1 * | 10/2006 | Brcka | 118/726 |
| 2006/0222768 A1 * | 10/2006 | Faguet | 427/248.1 |
| 2006/0222769 A1 * | 10/2006 | Brcka | 427/248.1 |
| 2007/0113789 A1 * | 5/2007 | Brcka | 118/726 |
| 2007/0218200 A1 * | 9/2007 | Suzuki et al. | 427/248.1 |

* cited by examiner

FIG. 4

US 7,351,285 B2

METHOD AND SYSTEM FOR FORMING A VARIABLE THICKNESS SEED LAYER

FIELD OF THE INVENTION

The invention relates to semiconductor processing, and more particularly, to a method and system for forming a variable thickness seed layer on a substrate, where the thickness profile of the seed layer improves uniformity of a metal layer electrochemically plated onto the seed layer.

BACKGROUND OF THE INVENTION

The introduction of copper (Cu) metal into multilayer metallization schemes for manufacturing integrated circuits, enabled by the Damascene copper plating process, is now extensively used by manufacturers of advanced microprocessors and application-specific chips. As the minimum feature dimensions on patterned substrates (wafers) steadily decreases, several consequences of this downward scaling are becoming apparent. One concern is the extendibility of physical vapor deposition (PVD) to produce copper seed (nucleation) layers for electrochemical plating of the substrate and the features formed on the substrate. These seed layers must become increasingly thinner due to the decreasing minimum feature sizes, and unless significant improvements in the PVD-Cu step coverage are made, it may not be possible to achieve robust continuous film of copper onto these features (e.g., on the lower sidewall of a via hole) to permit consistent nucleation of electrodeposition.

Alternatives to PVD-Cu seed layers for copper electroplating include non-Cu seed layers, for example ruthenium (Ru) seed layers that can be highly conformally deposited by chemical vapor deposition (CVD) or atomic-layer deposition (ALD). One challenge that Cu and non-Cu seeds pose to electrochemical plating processing and the plating equipment is non-uniform thickness of the plated Cu metal onto the seed layer due to the terminal ('resistive substrate') effect. The terminal effect is the tendency for the current density to be non-uniform as a result of the ohmic potential drop associated with conducting current from the wafer edge to the entire wafer surface through a thin resistive seed layer. This problem can be more severe for a highly resistive non-Cu (e.g., Ru) seed layer than a lower resistivity Cu seed layer. The sheet resistance of a non-Cu seed layer can be orders of magnitude higher than that of today's Cu seed layers and straightforward extension of methods currently used to manipulate current distribution (e.g., electrolyte conductivity) generally will not be adequate to combat the terminal effect experienced using a non-Cu seed layer. Therefore, new methods are required to improve the uniformity of a copper metal layer electrochemically plated onto a non-Cu seed layer.

SUMMARY OF THE INVENTION

A method is provided for forming a variable thickness seed layer on a substrate, where the seed layer thickness at the edge of the substrate is less than the thickness at the center of the substrate. The variable thickness seed layer improves uniformity of an electrochemically plated metal layer deposited onto the variable thickness seed layer compared to when using a constant thickness seed layer.

According to an embodiment of the invention, the method includes providing a substrate to a process chamber of a deposition system containing a showerhead, the showerhead comprising an inner gas delivery zone and an outer gas delivery zone. The center of the substrate is generally aligned with the inner gas delivery zone and the edge of the substrate is generally aligned with the outer gas delivery zone. The method further includes depositing a seed layer on the substrate by exposing the substrate to a first gas flowed through the inner gas delivery zone, wherein the first gas comprises a first amount of a metal-containing precursor, and exposing the substrate to a second gas flowed through the outer gas delivery zone, wherein the second gas comprises the metal-containing precursor in a second amount between zero and a value less than the first amount. By introducing no precursor or less precursor through the outer gas delivery zone generally aligned with the edge of the substrate, the metal seed layer is deposited with a thickness at the edge of the substrate that is less than the thickness at the center of the substrate.

According to an embodiment of the invention, a deposition system is provided. The deposition system contains a substrate holder positioned in a process chamber and configured for supporting a substrate thereon with the center and edge of the substrate in general alignment with the center and edge, respectively, of the substrate holder. The substrate holder is also configured to heat the substrate. The deposition system further contains a showerhead facing the substrate holder, the showerhead comprising an inner gas delivery zone generally aligned with the center of the substrate holder and an outer gas delivery zone generally aligned with the edge of the substrate holder. A first gas source comprising a metal-containing precursor is coupled to the inner gas delivery zone and a second gas source, optionally comprising the metal-containing precursor, is coupled to the outer gas delivery source. The deposition system further comprises a transfer system configured to transfer the substrate into and out of the process chamber, and a controller configured for controlling the deposition system during exposure of the substrate to the first and second gas to introduce a greater amount of metal-containing precursor through the inner gas delivery source than through the outer gas delivery source to deposit a variable thickness seed layer on the substrate, wherein the seed layer thickness at the edge of the substrate is less than the thickness at the center of the substrate.

DETAILED DESCRIPTION OF SEVERAL EMBODIMENTS OF THE INVENTION

Embodiments of the invention provide a method for forming a variable thickness seed layer on the field of a substrate, where the variable thickness refers to an increase in the seed layer thickness from the edge of the substrate toward the center of the substrate. The seed layer thickness profile improves uniformity of a metal layer electrochemically plated onto the seed layer.

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1A:
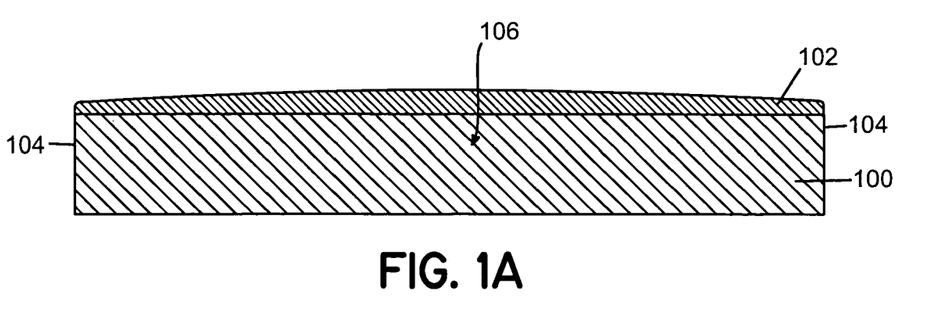
FIG. 1A schematically shows a cross-sectional view of a substrate containing a variable thickness seed layer according to an embodiment of the invention.

Referring now to the drawings, FIG. 1A schematically shows a cross-sectional view of a substrate 100 containing a variable thickness seed layer 102 according to an embodiment of the invention. The substrate 100 can, for example, be a Si substrate. A Si substrate can be of n- or p-type, depending on the type of device being formed. The substrate 100 can be of any size, for example a 200 mm substrate, a 300 mm substrate, or an even larger substrate. According to embodiments of the invention, the thickness of the seed layer 102 increases from the edge 104 of the substrate 100 toward the center 106 of the substrate 100. According to one embodiment of the invention, the thickness of the seed layer 102 can be between about 5 angstrom to about 100 angstrom at or near the edge 104 of the substrate 100 and the thickness of the seed layer 104 can be between about 20 angstrom to about 200 angstrom at or near the center 106 of the substrate 100. According to another embodiment of the invention, the thickness of the seed layer 104 can be between about 10 angstrom to about 40 angstrom at or near the edge 104 of the substrate 100 and the thickness of the seed layer 104 can be between about 20 angstrom to about 80 angstrom at or near the center 106 of the substrate 100. It may be understood that an increase "toward" the center need not be limited to a radial increase from the edge to the very center point, but rather, includes an increase from the edge to some point between the edge and the center.

As described above, during an electroplating process to plate a metal on a seed layer, there is a tendency for the current density to be non-uniform as a result of the ohmic potential drop associated with conducting current from the substrate edge to the entire substrate surface. The current density during the plating process can vary as a function of radial location on the substrate, which in turn can result in variations in the plating layer thickness versus radial location on the substrate. In particular, the deposition rate of the plated metal layer can be higher near the edge of the substrate than at the center of the substrate, especially during early stages of a plating process where little metal has been plated on the substrate.

Embodiments of the invention can reduce or eliminate the above-mentioned problems encountered during an electrochemical plating process where a metal layer (e.g., Cu) is deposited onto a resistive seed layer using electrical contacts along the circumference of the substrate. In order to minimize the terminal effect, which tends to deposit a thicker metal layer near the contacts, the variable thickness seed layer shown in FIG. 1 can reduce the current density non-uniformity during a plating process, thereby resulting in a more uniform metal plating thickness on the substrate.

Figure 1B:
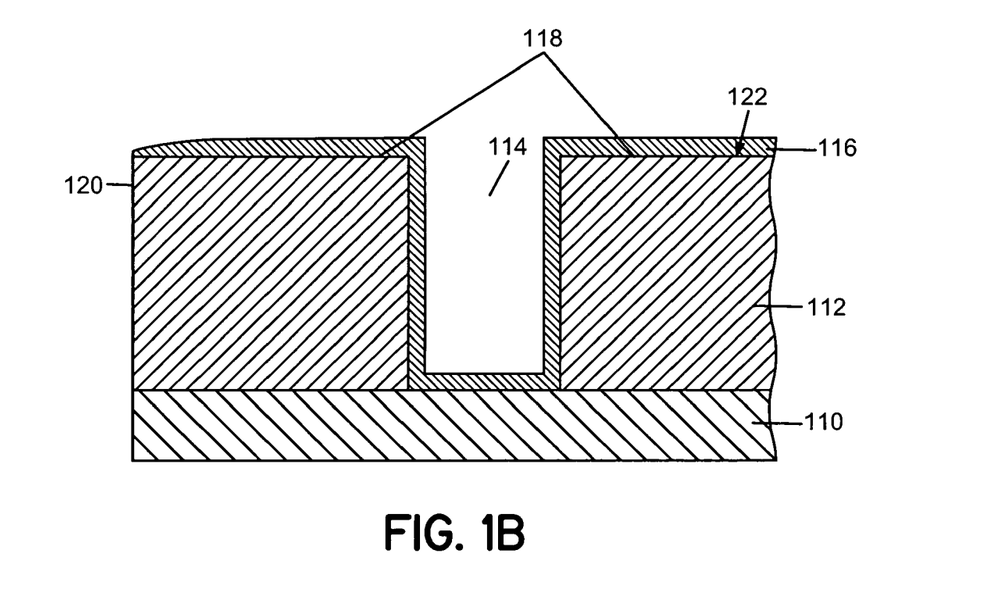
FIG. 1B schematically shows a partial cross-sectional view of a patterned substrate according to an embodiment of the invention.

Embodiments of the invention can be applied to unpatterned and patterned substrates. FIG. 1B schematically shows a cross-sectional view of a substrate 110 containing a conformal variable thickness seed layer 116 deposited onto an opening 114 in a layer 112 formed on the substrate 110 and onto the field 118 away from the opening 114. The thickness of the seed layer 116 is less at or near the edge 120 of the layer 112 than at or near the center 122. The thickness of the seed layer 116 on the field 118 can also be different from the thickness of the seed layer in the opening 114. The layer 112 can, for example, be a dielectric material. As will be appreciated by those skilled in the art, the patterned substrate 110 can, in general, contain one or more vias or trenches, or a combination thereof. The vias and trenches can, for example, have openings that are in the sub-micron range, for example less than 65 nm or less than 45 nm. The vias and trenches can have high aspect ratios (depth/width), for example between about 2 and about 10, but the invention is not limited to these aspect ratios. As those skilled in the art will appreciate, the structure in FIG. 1B can further contain a diffusion barrier layer (not shown) formed beneath the seed layer 116 on the exposed surfaces of the layer 112 and the substrate 110. The barrier layer can, for example, be a tantalum-containing layer (e.g., Ta, TaN, or TaCN, or a combination thereof) or a tungsten-containing layer (e.g., W, or WN, or a combination thereof).

Figure 2:
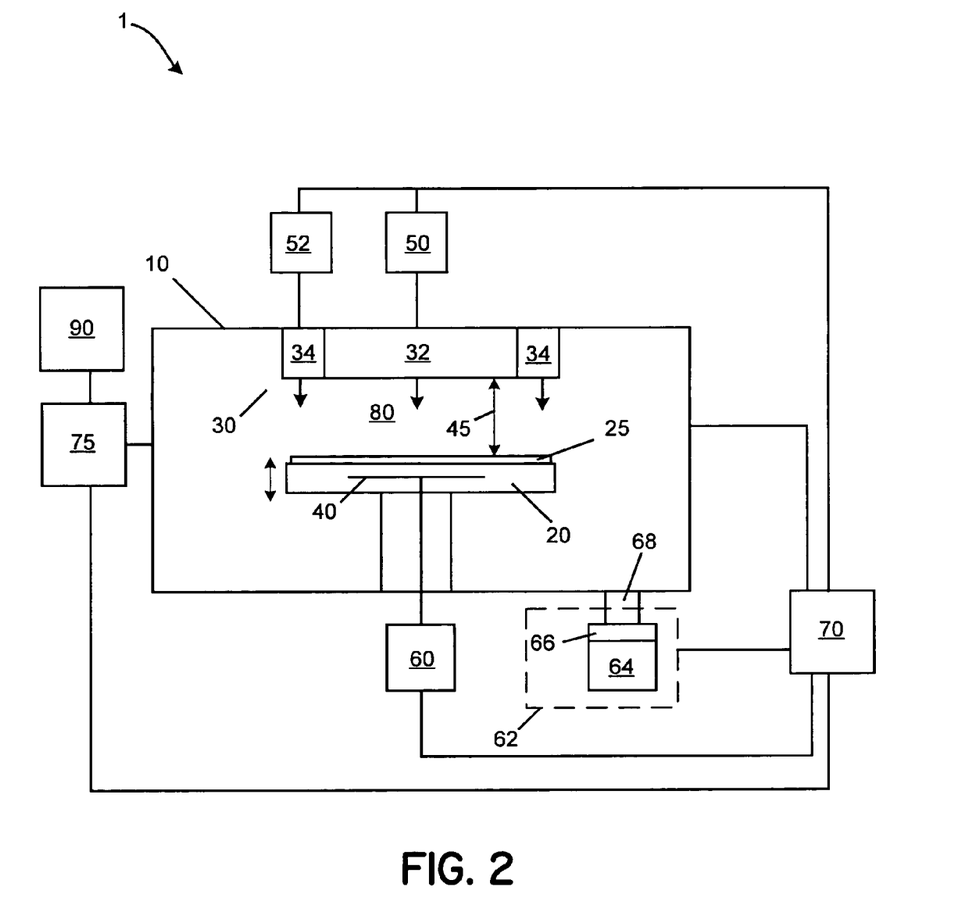
FIG. 2 is a schematic view of a deposition system for depositing a variable thickness seed layer onto a substrate according to an embodiment of the invention.

FIG. 2 is a schematic view of a deposition system for depositing a variable thickness seed layer onto a substrate according to an embodiment of the invention. The deposition system 1 comprises a process chamber 10 having a substrate holder 20 configured to support a substrate 25, upon which the seed layer is formed. The substrate 25 is positioned on the substrate holder 20 with the edge and center of the substrate 25 generally aligned with the edge and center, respectively, of the substrate holder 20. A showerhead 30 faces the substrate 25 and the substrate holder 20. The vertical position of the substrate holder 20 relative to the showerhead 30 can be adjusted to change the gap 45 between the bottom of the showerhead 30 and the substrate 25 residing on the substrate holder 20. The gap 45 can, for example, be adjusted from about 5 mm to about 50 mm. The showerhead 30 is configured for introducing gases into the processing zone 80 between the substrate 25 and the showerhead 30. The showerhead 30 has an inner gas delivery zone 32 generally aligned with the center of the substrate 25 and the center of the substrate holder 20, and an outer gas delivery zone 34 generally aligned with the edge of the substrate 25 and the edge of the substrate holder 20. The outer gas delivery zone 34 depicted in FIG. 2 can be an annular gas distribution element. It may be understood that general alignment does not require precise alignment, but only a general correlation of position between edge portions and center portions of the respective components.

A first gas source 50 and a second gas source 52 are coupled to the inner gas delivery zone 32 and outer gas delivery zone 34, respectively. The first gas source 50 contains a metal precursor evaporation system (not shown) for supplying as first gas containing a metal-containing precursor to the processing zone 80 of process chamber 10 via inner gas delivery zone 32. An exemplary metal precursor evaporation system is described in U.S. patent application Ser. No. 10/996,144 (TTCA-014), entitled METHOD AND DEPOSITION SYSTEM FOR INCREASING DEPOSITION RATES OF METAL LAYERS FROM METAL-CARBONYL PRECURSORS, the entire content of which is herein incorporated by reference. The first gas can further contain an inert gas (e.g., $N_2$, helium or argon), a reducing gas (e.g., hydrogen), or carbon monoxide, or a combination of two or more thereof. The second gas source 52 is configured for supplying a second gas to the processing zone 80 via outer gas delivery zone 34. The second gas can, for example, contain an inert gas (e.g., $N_2$, helium or argon), a reducing gas (e.g., hydrogen), or carbon monoxide, or a combination of two or more thereof. Optionally, the second gas source 52 may further include a metal precursor evaporation system (not shown) for supplying metal-containing precursor through the outer gas delivery zone. However, the gas sources 50, 52 and/or delivery zones 32, 34 should then be configured to provide a greater quantity of metal-containing precursor through the inner gas delivery zone 32 than through the outer gas delivery zone, whether by adjusting the relative concentrations or the relative flow rates.

The process chamber 10 is operatively coupled to a (robotic) substrate transfer system 75 configured for moving the substrate 25 into and out of the process chamber 10. The process chamber 10 is further coupled to a vacuum pumping system 62 through a duct 68, wherein the pumping system 62 contains a vacuum pump 64 and a pressure controller 66. The pumping system 62 is configured to evacuate the process chamber 10 to a pressure suitable for forming the seed layer on the substrate 25. Furthermore, a substrate holder temperature control system 60 is coupled to a substrate heater 40. The substrate heater 40 can, for example, include one or more resistive heating elements. Alternately, the heater 40 can, for example, include a radiant heating system, such as a tungsten-halogen lamp. The substrate holder 20 is configured to elevate the temperature of the substrate 25 by virtue of the substrate holder 20 being coupled to the substrate temperature control system 60. For example, the substrate temperature control system 60 can be configured to elevate the temperature of the substrate 25 up to approximately 600° C. Additionally, the process chamber 10 can be coupled to a chamber temperature control system (not shown) configured to control the temperature of the chamber walls.

Still referring the FIG. 2, the deposition system 1 includes a processing system controller 70 configured to operate and control the operation of the deposition system 1. The controller 70 is coupled to the process chamber 10, the substrate transfer system 75, the substrate temperature control system 60, the first gas supply system 50, the second gas supply system 52, and the vacuum pumping system 62. The controller 70 includes a microprocessor, a memory, and a digital I/O port capable of generating control voltages sufficient to communicate and activate inputs of the deposition system 1 as well as monitor outputs from the deposition system 1. A program stored in the memory is utilized to control the aforementioned components of deposition system 1 according to a stored process recipe. One example of processing system controller 70 is a DELL PRECISION WORKSTATION 610™, available from Dell Corporation, Dallas, Tex. The controller 70 may also be implemented as a general-purpose computer, digital signal process, etc.

The controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1, or it may be remotely located relative to the deposition system 1 via an internet or intranet. Thus, controller 70 can exchange data with the deposition system 1 using at least one of a direct connection, an intranet, or the internet. Controller 70 may be coupled to an intranet at a customer site (i.e., a device maker, etc.), or coupled to an intranet at a vendor site (i.e., an equipment manufacturer). Furthermore, another computer (i.e., controller, server, etc.) can access controller 70 to exchange data via at least one of a direct connection, an intranet, or the internet.

According to an embodiment of the invention, the deposition system 1 is configured for depositing a variable thickness seed layer on the substrate 25 by exposing the substrate 25 to a first gas containing a metal-containing precursor flowed through the inner gas delivery zone 32 and exposing the substrate 25 to a second gas flowed through the outer gas delivery zone 34. Once the first and second gases enter the processing zone 80 of the process chamber 10, the metal-containing precursor is exposed to the heated substrate 25 to deposit a seed layer on the substrate. The deposition rate and the resulting thickness profile of the seed layer, i.e., increasing seed layer thickness from the edge of the substrate toward the center of the substrate, are controlled by the composition and relative flows of the first and second gases to the process zone 80.

FIG. 2 further shows an electrochemical plating system 90 operatively coupled to the transfer system 75 and the substrate chamber 10. Electrochemical plating systems and methods of electroplating a metal layer on a seed layer are well known to those skilled in the art, for example, copper electrochemical plating methods using acidified copper sulfate electrolyte. The electrochemical plating system 90 may be operated by the controller 70, or alternately it may operate with its own controller (not shown). According to an embodiment of the invention, a variable thickness seed layer is deposited onto the substrate 25 in the process chamber 10 and the substrate is then transferred via the transfer system 75 to the electrochemical plating system 90 for copper electrochemical plating onto the seed layer.

Figure 3:
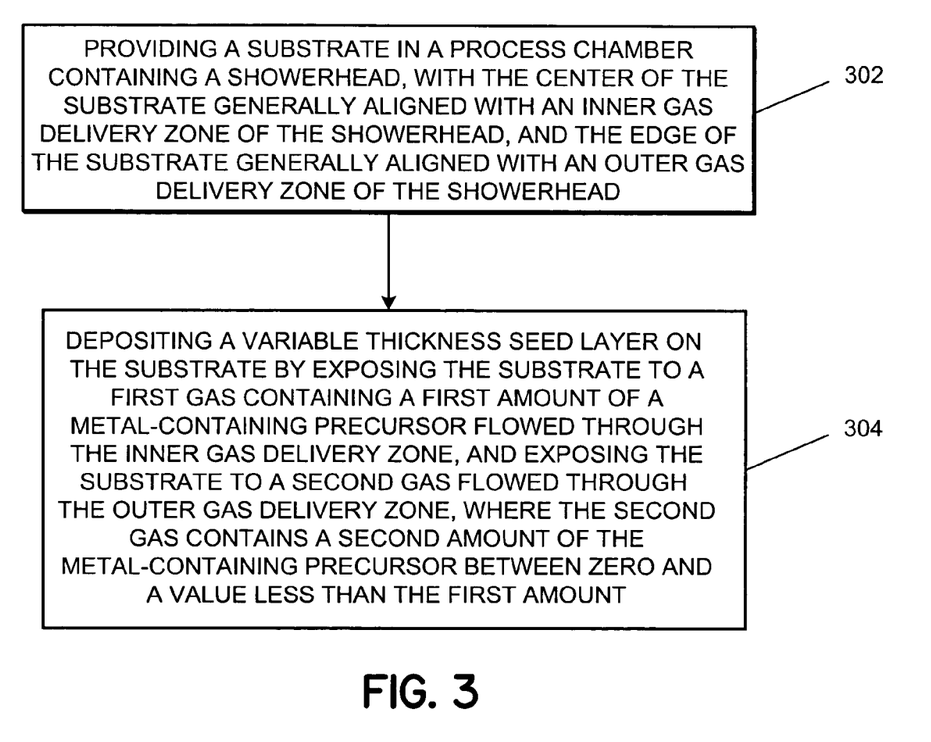
FIG. 3 is a flow diagram showing a method of forming a variable thickness seed layer onto a substrate according to an embodiment of the invention.

FIG. 3 is a flow diagram showing a method of forming a variable thickness seed layer onto a substrate according to an embodiment of the invention. The method includes in step 302, providing a substrate in a process chamber containing a showerhead, with the center of the substrate generally aligned with an inner gas delivery zone of the showerhead and the edge of the substrate generally aligned with an outer gas delivery zone of the showerhead. For example, the seed layer can be deposited onto a substrate using the process chamber 10 of the deposition system 1 depicted in FIG. 2.

In step 304, a variable thickness seed layer is deposited on the substrate by exposing the substrate to a first gas containing a first amount of a metal-containing precursor flowed through the inner gas delivery zone and to a second gas flowed through the outer gas delivery zone, wherein the second gas contains a second amount of a metal-containing precursor between zero and a value less than the first amount. The thickness profile of the seed layer can be controlled by the compositions and relative flows of the first and second gases. For example, increasing the concentration of the metal-containing precursor in the first gas and/or increasing the flow of the second gas (in particular, when it contains no metal-containing precursor) relative to the first gas flow generally increases the thickness of the seed layer at the center of the substrate relative to the thickness of the seed layer at the edge of the substrate. In addition, the thickness profile of the deposited seed layer can be controlled by adjusting the gap between the showerhead and the substrate in combination with varying the flow of the second gas relative to the flow of the first gas. In general, when a narrow gap is used, gas concentration at the substrate goes up, thereby increasing the deposition rate at the edge and the center of the substrate. Thus, the flow rate of the second gas can be increased relative to the flow rate of the first gas rate to dilute the metal-containing precursor near the edge of the substrate and obtain the desired thickness profile of the seed layer.

The metal-containing precursor can, for example, be a metal-carbonyl precursor or an organometallic precursor suitable for depositing a seed layer on the substrate 25, but the invention is not limited to these precursors. According to an embodiment of the invention, the metal-containing precursor can be a ruthenium-containing precursor, but this is not required for the invention as other metal-containing precursors capable of forming a seed layer suitable for a subsequent electrochemical plating process can be utilized. According to an embodiment of the invention, the ruthenium-containing precursor can be a ruthenium-carbonyl precursor such as $Ru_3(CO)_{12}$ or a ruthenium organometallic precursor such as (2,4-dimethylpentadienyl)(ethylcyclopentadienyl) ruthenium (Ru(DMPD)(EtCp)), bis(2,4-dimethylpentadienyl)ruthenium (Ru(DMPD)$_2$), or (2,4-dimethylpentadienyl)(methylcyclopentadienyl)ruthenium. The above-mentioned precursors are not required for the invention, as other ruthenium precursors may be used, including the liquid organometallic precursor bis(ethylcyclopentadienyl) ruthenium (Ru(EtCp)$_2$).

According to an embodiment of the invention, the first gas can contain $Ru_3(CO)_{12}$ and an inert gas, and the second gas can contain an inert gas and no precursor.

According to another embodiment of the invention, the first gas can contain $Ru_3(CO)_{12}$ and one or both of carbon monoxide or an inert gas, and the second gas can contain an inert gas, carbon monoxide, or a combination thereof, and no precursor.

According to still another embodiment of the invention, the first gas can contain an organometallic ruthenium precursor and a reducing gas, or an inert gas, or a combination thereof, and the second gas can contain a reducing gas, an inert gas, or a combination of thereof, and no precursor. The organometallic ruthenium precursor can, for example, be selected from any of the above-mentioned organometallic ruthenium precursors.

According to an embodiment of the invention, the process chamber pressure can be maintained at a pressure between about 5 mTorr and about 30 Torr during depositing of the seed layer. According to another embodiment of the invention, the process chamber pressure can be maintained between about 10 mTorr and about 500 mTorr during depositing of the seed. According to an embodiment of the invention, the substrate temperature can be between about 100° C. and about 600° C. According to another embodiment of the invention, the substrate temperature can be between about 150° C. and about 400° C. According to yet another embodiment of the invention, the substrate temperature can be between about 200° C. and about 300° C.

Figure 4:
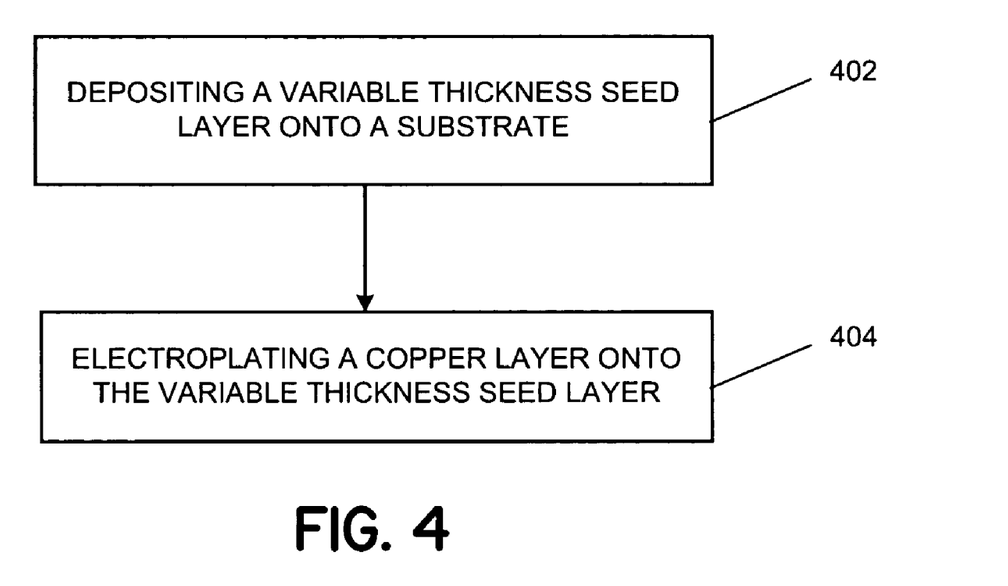
FIG. 4 is a flow diagram for forming metallic interconnects according to an embodiment of the invention.

FIG. 4 is a flow diagram for forming metallic interconnects according to an embodiment of the invention. In step 402, a variable thickness seed layer is deposited onto a substrate. The variable thickness seed layer can be deposited onto the substrate by the method described in FIG. 3 using the deposition system 1 described in FIG. 2. In step 404, a copper layer is electroplated onto the variable thickness seed layer. The copper layer can be electroplated utilizing the electrochemical plating system 90 described in FIG. 2.

As would be appreciated by those skilled in the art, each of the steps or stages in the flowcharts of FIGS. 3 and 4 may encompass one or more separate steps and/or operations. Accordingly, the recitation of only two steps 302, 304 of FIG. 3 and two steps 402, 404 of FIG. 4 should not be understood to limit the method of the present invention solely to two steps or stages. Moreover, each representative step or stage 302, 304, 402, 404 should not be understood to be limited to only a single process.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming a seed layer in a process chamber containing a showerhead, the showerhead comprising an inner gas delivery zone and an outer gas delivery zone, the method comprising:
 providing a substrate in said process chamber with a center of the substrate generally aligned with the inner gas delivery zone and an edge of the substrate generally aligned with the outer gas delivery zone; and
 depositing a variable thickness Ru seed layer on the substrate by:
  exposing the substrate to a first gas flowed through the inner gas delivery zone, the first gas comprising $Ru_3(CO)_{12}$ in a first amount and carbon monoxide, and
  exposing the substrate to a second gas flowed through the outer gas delivery zone, the second gas comprising $Ru_3(CO)_{12}$ in a second amount between zero and a value less than the first amount, and an inert gas or carbon monoxide, or a combination thereof,
whereby the Ru seed layer is deposited with a thickness at the edge of the substrate that is less than a thickness at the center of the substrate.

2. The method according to claim 1, further comprising: adjusting the gap between the showerhead and the substrate to control the thickness profile of the seed layer.

3. The method according to claim 2, wherein the gap is between about 5 mm and about 50 mm.

4. The method according to claim 1, wherein the first gas, the second gas, or both, further comprise a reducing gas.

5. The method according to claim 4, wherein the inert gas comprises a noble gas, $N_2$, or both, and the reducing gas comprises hydrogen.

6. The method according to claim 1, wherein the substrate comprises a patterned substrate containing one or more vias or trenches, or combinations thereof.

7. The method according to claim 1, further comprising:
 forming a metal layer on the Ru seed layer in an electrochemical plating process.

8. The method according to claim 7, wherein the metal layer comprises Cu.

9. The method according to claim 1, wherein the second gas comprises zero metal-containing precursor.

10. The method according to claim 1, wherein the first amount is at least twice the value of the second amount.

11. The method according to claim 1, wherein the first gas further comprises the inert gas.

12. The method according to claim 11, wherein the inert gas comprises a noble gas, $N_2$, or both.

* * * * *